United States Patent
Ranish

(10) Patent No.: US 6,805,466 B1
(45) Date of Patent: Oct. 19, 2004

(54) LAMPHEAD FOR A RAPID THERMAL PROCESSING CHAMBER

(75) Inventor: Joseph M. Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/595,765

(22) Filed: Jun. 16, 2000

(51) Int. Cl.[7] .................................................. F21V 7/00
(52) U.S. Cl. ........................ 362/247; 362/241; 362/373; 219/405
(58) Field of Search ................................. 362/247, 227, 362/241, 264, 294, 345, 373; 374/121, 128; 219/405

(56) References Cited

U.S. PATENT DOCUMENTS

| | | | |
|---|---|---|---|
| 5,155,336 A | * | 10/1992 | Gronet et al. ............ 219/405 |
| 5,446,825 A | | 8/1995 | Moslehi et al. |
| 5,740,314 A | * | 4/1998 | Grimm ...................... 362/241 |
| 5,755,511 A | * | 5/1998 | Peuse et al. ............. 374/128 |
| 5,892,886 A | | 4/1999 | Sandhu |
| 6,072,160 A | * | 6/2000 | Bahl ........................ 219/405 |

FOREIGN PATENT DOCUMENTS

| | | |
|---|---|---|
| EP | 0 978 865 A2 | 5/1999 |
| WO | 01/19291 | 6/2001 |

* cited by examiner

Primary Examiner—Thomas Sember
Assistant Examiner—B Q Truong
(74) Attorney, Agent, or Firm—Charles S. Guenzer, Esq.

(57) ABSTRACT

A lamphead includes a monolithic member. A plurality of lamp receptacles and reflector cavities are formed in the monolithic member.

40 Claims, 4 Drawing Sheets

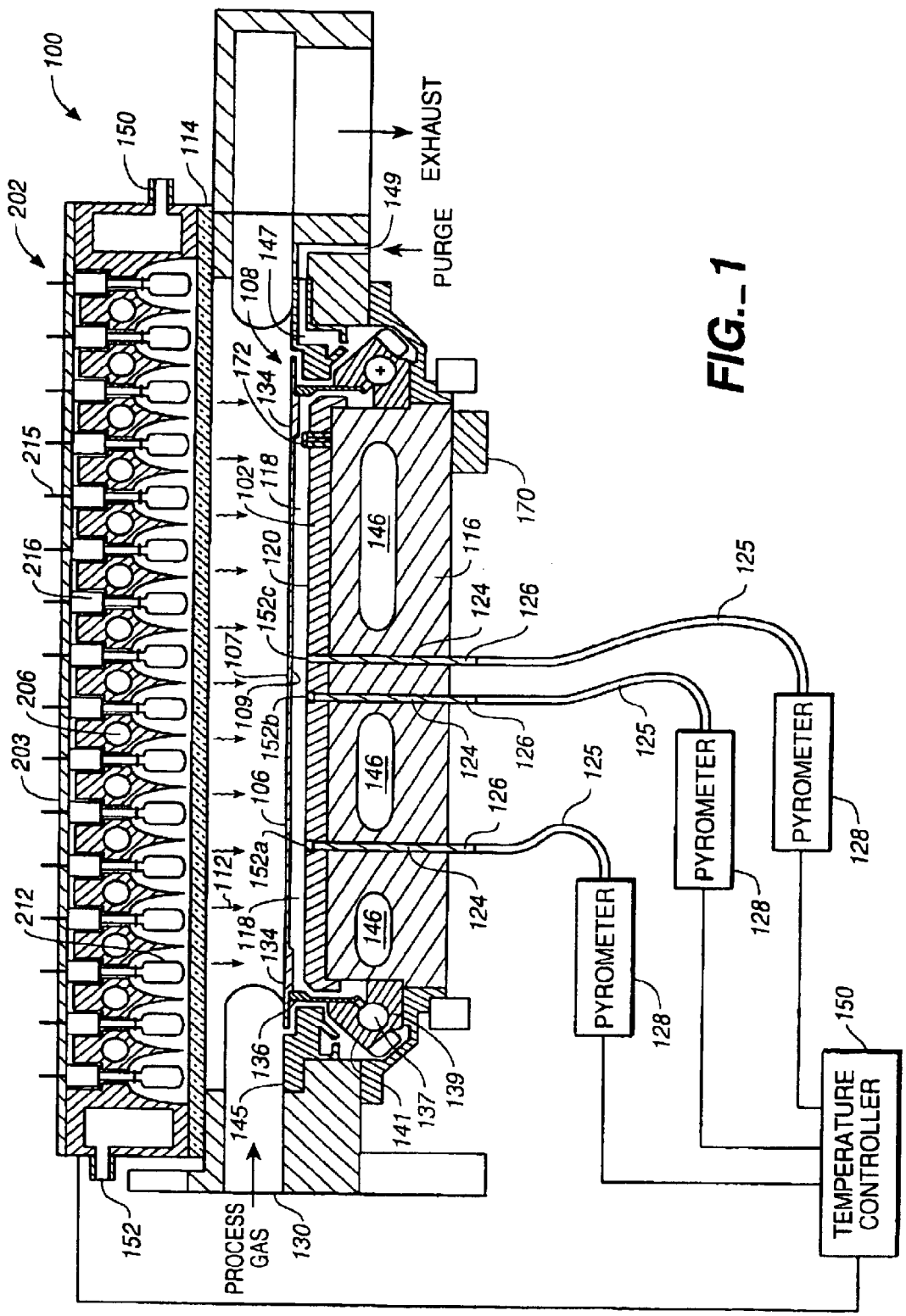
FIG._1

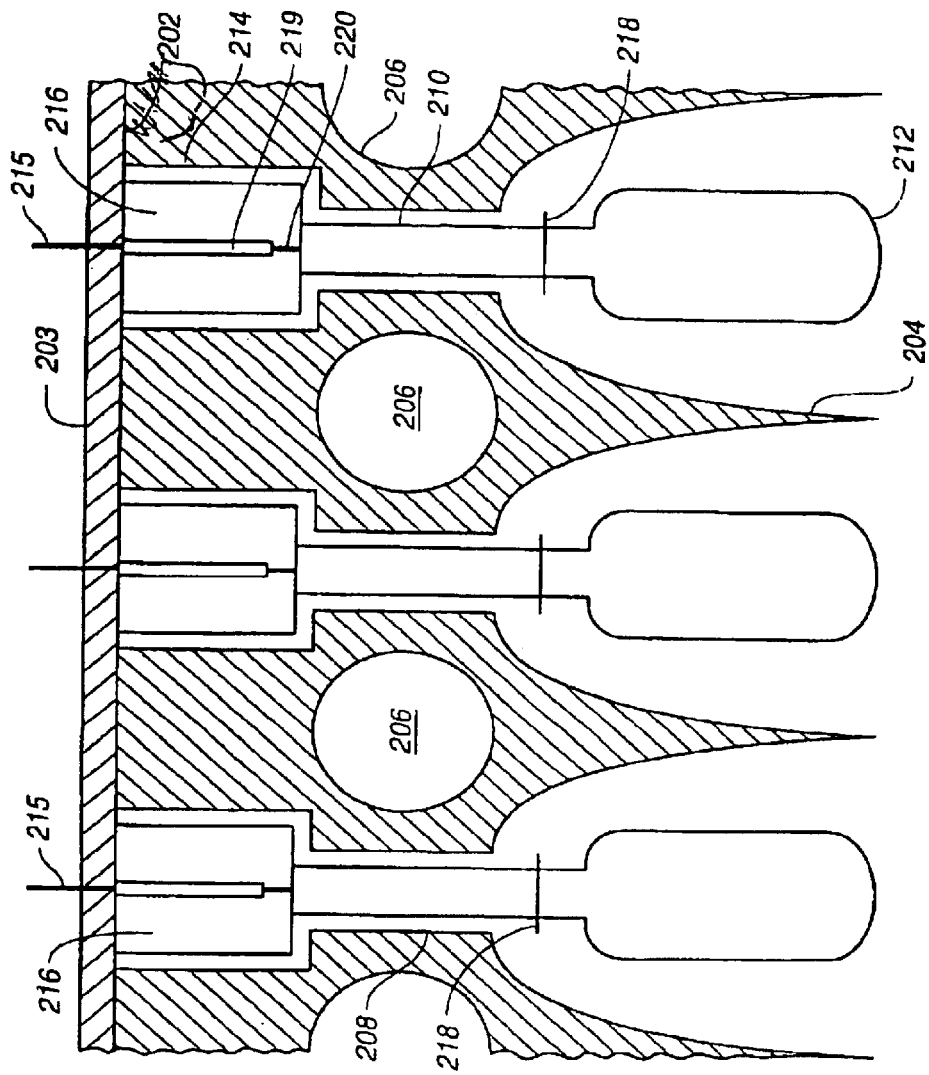
FIG._2

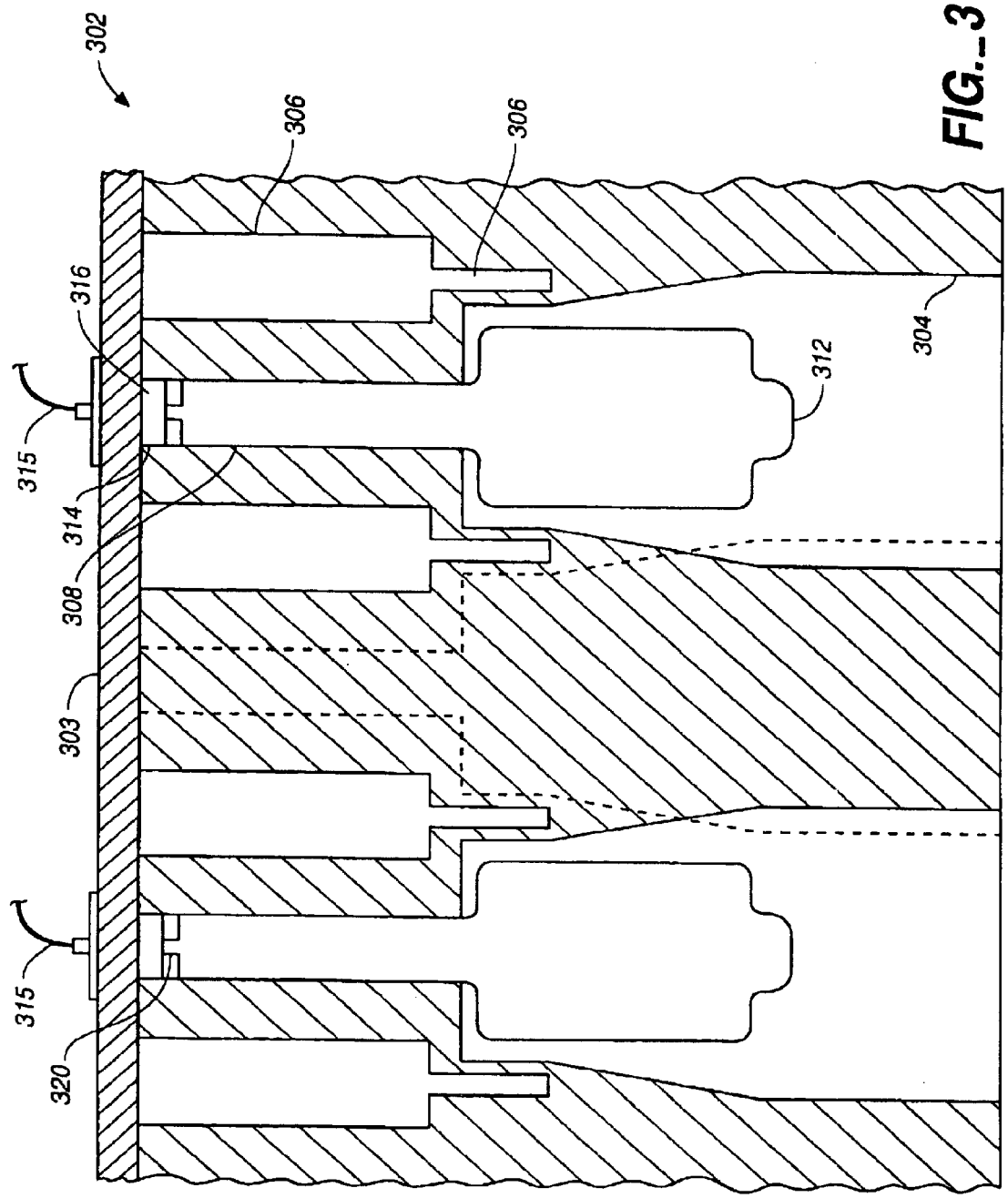

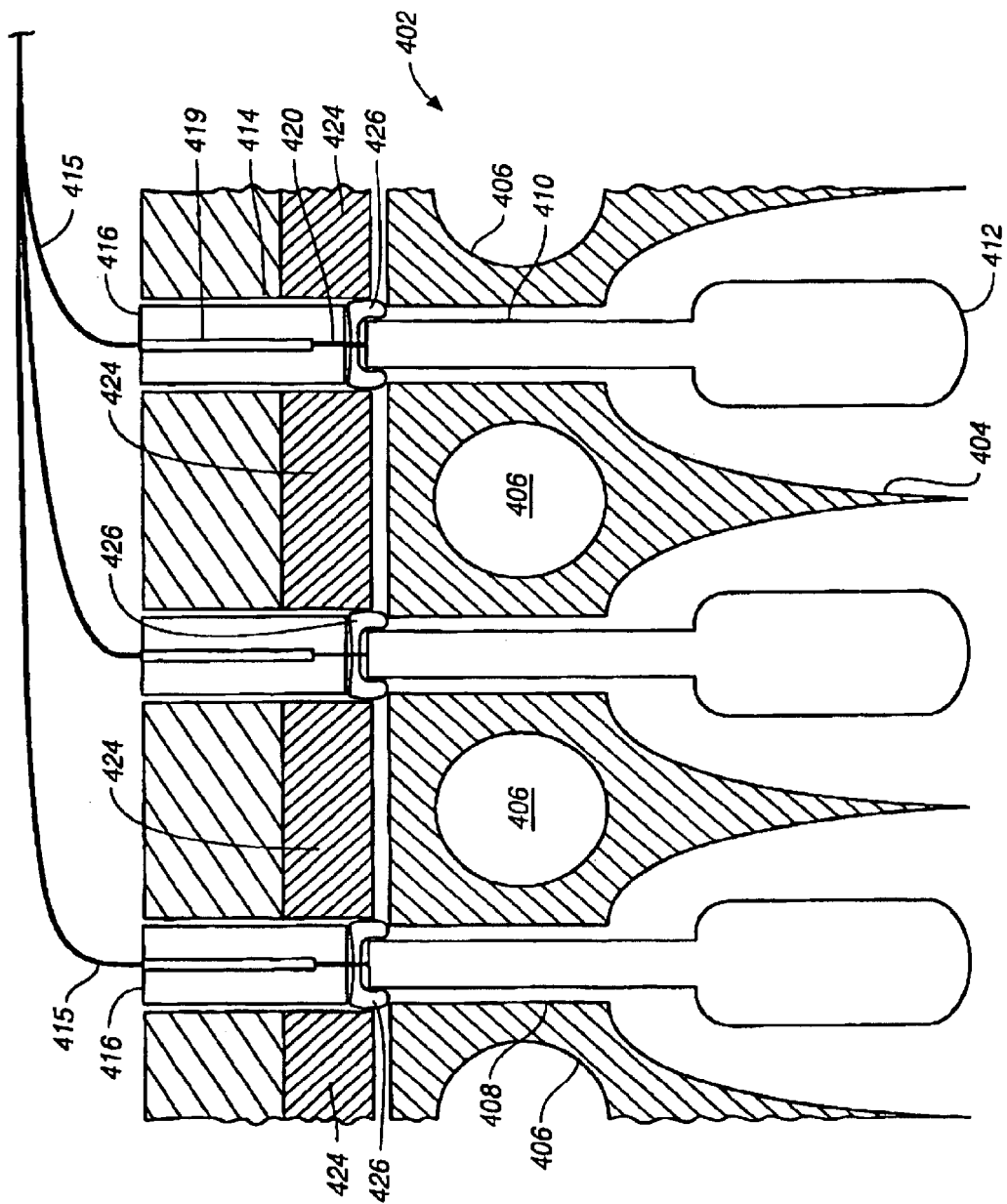
FIG._4

LAMPHEAD FOR A RAPID THERMAL PROCESSING CHAMBER

BACKGROUND OF THE INVENTION

This invention relates generally to a semiconductor processing system and, more specifically, to a semiconductor processing system having an improved lamphead.

Rapid thermal processing (RTP) systems are employed in semiconductor chip fabrication to create, chemically alter or etch surface structures on semiconductor wafers. One such RTP system, as described in U.S. Pat. No. 5,155,336, which is assigned to the assignee of the subject application and which is incorporated herein by reference, includes a semiconductor processing chamber and a heat source assembly or lamphead located on the semiconductor processing chamber.

A number of infrared lamps are located in the lamphead. During processing, infrared radiation from the lamps radiate through an upper window, light passageways and a lower window onto a rotating semiconductor substrate in the processing chamber. In this manner, the wafer is heated to a required processing temperature.

During semiconductor processing operations, the lamps operate at extremely high temperatures. Elaborate structures have been designed to conduct heat away from the lamp base. According to such techniques, the lamp base (also referred to as a "press seal") is encapsulated within a precision outer diameter stainless steel tube using a high thermal conductivity potting compound. This high precision stainless steel tube is inserted into another high precision stainless steel tube which has its outer surface (for most of its length) water cooled. This cooling mechanism causes the lamp to operate at a temperature low enough to permit long lamp life. However, this cooling mechanism can be expensive to implement, manufacture and maintain.

SUMMARY OF THE INVENTION

In general, the invention is directed to a semiconductor processing system. In one aspect, the invention features a lamphead for use in semiconductor processing. The lamphead includes a monolithic member. A plurality of lamp receptacles and reflector cavities are formed in the monolithic member. Each lamp receptacle is adapted to support a lamp and each reflector cavity is shaped to act as a reflector for the lamp.

In another aspect, the invention is directed to a process chamber having a support on which a substrate may be positioned during processing. The processing system further includes a monolithic lamphead having a plurality of lamp receptacles and reflector cavities formed therein. Each lamp receptacle is adapted to support a lamp and each reflector cavity is shaped such that the lamps direct radiant energy onto a substrate on the support.

In yet another aspect, the invention features an apparatus for processing a substrate. The apparatus includes a processing chamber having a support on which a substrate may be positioned during processing. A monolithic lamphead having a plurality of lamp receptacles and reflector cavities is part of the apparatus. The lamp receptacles are adapted to support a lamp, and the reflector cavities are shaped such that the lamps direct radiant energy onto a substrate on the support.

A plurality of coolant passages are formed in the monolithic lamphead. A reflective coating is formed on a surface of each reflector cavity. The reflective coating may comprise gold or a dielectric stack on a gold layer. A plurality of lead passages may be formed in the lamphead such that each lead passage extends between a lamp receptacle and a reflector cavity. Each lead passage is adapted to receive a lamp seal.

The semiconductor processing system may further include at least one lampholder having receptacles for the outer leads of a lamp, a ferrofluid and one or more magnets disposed about the lampholder to maintain the position of the ferrofluid near the receptacles. As such, when the lamp leads are inserted into the lampholder receptacles, the ferrofluid surrounds the leads to suppress arcing between the leads. The leads may be magnetic such that the magnets maintain the position of the lamp.

Among the advantages of the invention are the following. Reflector and lamp-wall cooling is improved by eliminating gap thermal barriers and by permitting closer proximity of coolant passages to the reflector surfaces. By eliminating the need for base and potting compounds, the use of lamps having much simpler construction is enabled. Forward-directed reflector area is increased. The method of construction of the coolant channels is simplified.

Other features and advantages of the invention will be apparent from the following detailed description, the accompanying drawings and the claims.

BRIEF DESCRIPTION OF THE DRAWINGS

The invention is further described by way of examples with reference to the accompanying drawings.

FIG. 1 is schematic side view of a semiconductor processing system according to the invention.

In FIG. 2 is a schematic enlarged side-view of a portion of the monolithic lamphead-reflector of FIG. 1.

FIG. 3 is a cross-sectional view of a portion of another embodiment of a monolithic lamphead-reflector.

FIG. 4 is a cross-sectional view of a portion of yet another embodiment of a monolithic lamphead-reflector.

Like reference numbers and designations in the various figures indicate like elements.

DETAILED DESCRIPTION OF THE INVENTION

A semiconductor processing system including a heat source assembly and a semiconductor processing chamber are described. In the following description, specific details are set forth in order to provide a thorough understanding of the invention. It will be appreciated, however, by one skilled in the art that the invention may be practiced without these specific details. In other instances, well-known elements have not been shown in order to avoid unnecessarily obscuring the invention.

In the following description, the term substrate is intended to broadly cover any object that is being processed in a thermal process chamber and the temperature of which is being measured during processing. The term substrate includes, for example, semiconductor wafers, flat panel displays, glass plates or disks, and plastic workpieces.

An RTP system that has been modified in accordance with the invention is shown in FIGS. 1–2. The RTP system includes a processing chamber 100 for processing a disk-shaped, eight inch (200 mm) or twelve inch (300 mm) diameter silicon substrate 106. The substrate 106 is mounted inside the chamber on a substrate support structure 108 and is heated by a heating element or a monolithic lamphead-reflector 202 located above the substrate. The heating element 202 generates radiation 112 which is directed to a front side of the substrate and which enters the processing chamber 100 through a water-cooled quartz window assembly 114 Beneath the substrate 106 is a reflector 102 which is mounted on a water-cooled, stainless steel base 116. The base 116 includes a circulation circuit 146 through which coolant circulates to cool the reflector and reflecting surface. Water, which is above 23° C., is circulated through the base 116 to keep the temperature of the reflector well below that of the heated substrate. The reflector 102 is made of aluminum and has a highly reflective surface coating 120. An underside or backside 109 of the substrate 106 and the top of reflector 102 form a reflecting cavity 118 for enhancing the effective emissivity of the substrate.

The separation between the substrate and reflector may be approximately 0.3 of an inch (7.6 mm), thus forming a cavity which has a width-to-height ratio of about 27. In processing systems that are designed for eight-inch silicon wafers, the distance between the substrate 106 and the reflector 102 is about 3 mm and 9 mm. The width-to-height ratio of the cavity 118 should be larger than about 20:1. If the separation is made too large, the emissivity-enhancement effect that is attributable to the virtual blackbody cavity that is formed will decrease. On the other hand, if the separation is too small, for example less than about 3 mm, then the thermal conduction from the substrate to the cooled reflector will increase, thereby imposing an unacceptably large thermal load on the heated substrate, since the main mechanism for heat loss to the reflecting plate will be conduction through the gas. The thermal loading will, of course, depend upon the type of process gas and the chamber pressure during processing.

The temperatures at localized regions of the substrate 106 are measured by a plurality of temperature probes 152. Each temperature probe includes a sapphire light pipe 126 that passes through a conduit 124 that extends from the backside of the base 116 through the top of the reflector 102. The sapphire light pipe 126 is about 0.125 inch in diameter and the conduit 124 is slightly larger. The sapphire light pipe 126 is positioned within the conduit 124 so that its uppermost end is flush with or slightly below the upper surface of the reflector 102. The other end of light pipe 126 couples to a flexible optical fiber that transmits sampled light from the reflecting cavity to a pyrometer 128.

Each pyrometer is connected to a temperature controller 150 which controls the power supplied to the heating element 202 in response to a measured temperature. The heating element for a 200 mm wafer may use 187 lights to deliver highly collimated radiation from tungsten-halogen lamps to the processing chamber 100. The heating element for a 300 mm wafer may use 409 lights. The lamps are divided into multiple zones. The zones can be individually adjusted by the controller to allow controlled radiative heating of different areas of the substrate 106. Such a control system is described in U.S. Pat. No. 5,755,511, assigned to the assignee of the present invention, the entire disclosure of which is incorporated herein by reference.

As indicated above, the described embodiment uses measurement or temperature probes distributed over the reflector so as to measure the temperature at different radii of the substrate. During thermal processing, the substrate 106 is rotated at about 90 RPM. Thus, each probe actually samples the temperature profile of a corresponding annular ring area on the substrate.

The support structure which rotates the substrate includes a support or edge ring 134 which contacts the substrate around the substrate's outer perimeter, thereby leaving all of the underside of the substrate exposed except for a small annular region about the outer perimeter. The support ring 134 has a radial width of approximately one inch (2.5 centimeters (cm)). To minimize the thermal discontinuities that will occur at the edge of the substrate 106 during processing, the support ring 134 is made of the same, or similar, material as the substrate, for example silicon or silicon carbide.

The support ring 134 rests on a rotatable tubular quartz cylinder 136 that is coated with silicon to render it opaque in the frequency range of the pyrometers. The silicon coating on the quartz cylinder acts as a baffle to block out radiation from the external sources that might contaminate the intensity measurements. The bottom of the quartz cylinder is held by an annular upper bearing 141 which rests on a plurality of ball bearings 137 that are, in turn, held within a stationary, annular, lower bearing race 139. The ball bearings 137 are made of steel and coated with silicon nitride to reduce particulate formation during operation. The upper bearing race 141 is magnetically coupled to an actuator (now shown) which rotates the cylinder 136, the edge ring 134 and the substrate 106 during thermal processing.

A purge ring 145 that is fitted into the chamber body surrounds the quartz cylinder. The purge ring 145 has an internal annular cavity 147 which opens up to a region above upper bearing race 141. The internal cavity 147 is connected to a gas supply (not shown) through a passageway 149. During processing, a purge gas is flowed into the chamber through the purge ring 145.

The support ring 134 has an outer radius that is larger than the radius of the quartz cylinder so that it extends out beyond the quartz cylinder. The annular extension of the support ring beyond the cylinder 136, in cooperation with the purge ring 145 located below it, functions as a baffle which prevents stray light from entering the reflecting cavity at the backside of the substrate. To further reduce the possibility of stray light reflecting into the reflecting cavity, the support ring 134 and the purge ring 145 may also be coated with a material that absorbs the radiation generated by the heating element 202 (for example, a black or gray material).

During processing, a process gas can be introduced into the space between the substrate and the window assembly through an inlet port. Gases are exhausted through an exhaust port, which is coupled to a vacuum pump (not shown).

As shown in FIGS. 1 and 2, monolithic lamphead-reflector 202 includes a plurality of reflector cavities 204 formed therein. The inside surfaces of reflector cavities are coated with any suitable light reflecting material such as gold or a dielectric quarter-wave stack formed on top of a gold layer. The monolithic lamphead-reflector may be made from materials such as copper or aluminum.

A plurality of circular coolant passages 206 are also formed into the monolithic lamphead, in close proximity to the reflector cavities. The coolant passages transport a cooling fluid such as water. The cooling fluid is introduced into the coolant passages via an inlet 150 and removed at an outlet 152.

A plurality of lead passages 208 are also formed in the lamphead-reflector 202. The lead passages are sized to accept a press seal 210 of a lamp 212. A lamp shrink seal could also be used. Light from the lamps 212 is directed toward a substrate in the process chamber by the reflector cavities.

A plurality of lampholder receptacles 214 are formed in the monolithic lamphead-reflector to receive lamp sockets or lampholders 216. Lampholders 216 have receptacles 219 that receive the outer two leads or pins 220 of the lamps. The lamp leads are electrically connected via receptacles 219 to respective wires of wiring pair 215, which provide power to the lamps. The lampholder receptacles support the lamps when they are plugged into the lamphead.

Each lamp includes a radiation shield 218 to prevent lamp radiation from entering the lead passage 208. The radiation shield may be made of a aluminum, stainless steel or chrome-plated steel.

The lamps have no base other than the press seal or shrink seal, depending on which one is used. The lamp leads, as noted, engage directly into the lampholder to complete the electrical circuit. The outer lead or lamp seal can include features to enable a sound mechanical retention of the lamp, such as indents, which engage spring-loaded pins in the lampholder. A backing plate 203 can be secured to the uppermost surface of the lamphead-reflector 202 to hold the lampholders 216 within the lampholder receptacles 214.

The lamp seal of the lamp is cooled by its close proximity to the surrounding cooled metal surface of the lamphead-reflector. Heat transfer from the lamp seal area can be improved through the use of heat transfer fluids, pastes, or polymers. A thermally conductive gas lamp ambient, for example, helium, may also be used to cool the lamp walls as described in U.S. application Ser. No. 09/595,758, entitled "A Semiconductor Processing System with Lamp Cooling", filed on Jun. 16, 2000, assigned to the assignee of the subject application and which is incorporated herein by reference. In the case of a low-pressure helium ambient, provision must be made to prevent pin-to-pin arc-over, as described below.

The thermally conductive gas can be introduced into the monolithic lamphead-reflector 202 from a pressurized gas source (not shown) by means of an appropriate inlet port and passageways formed in the lamphead-reflector to establish a gas flow around the lamp walls. The gas can be exhausted through an outlet port.

Alternatively, the thermally conductive gas could be introduced into an enclosed environment, for example, a dome, formed over the top surface of the lamphead-reflector. Suitable passageways would be formed in the backing plate to permit gas flow around the lamp walls.

The reflector cavities, the lead passages and the lampholder receptacles can simply be machined into a one-piece block of copper or aluminum. The block may be substantially circular in shape. The reflector cavities and lamps may be arranged in the lamphead-reflector in any desired pattern. The lamps may be arranged, for example, as described in the above-mentioned U.S. Pat. No. 5,155,336. The number of lamps, as noted above, may vary.

The monolithic design of the lamphead-reflector eliminates the need for reflector sleeves. By eliminating the reflector sleeve thickness and associated tolerances, the lamp-to-lamp centerline distances can be reduced. In one implementation, these distances are reduced from 0.75 inches to 0.63 inches. This permits the use of more lamps which increases power.

FIG. 3 is a cross-sectional view of a portion of a monolithic lamphead-reflector 302. A plurality of reflector cavities 304 and lead passages 308 are formed within lamphead-reflector 302. A lamp 312 is disposed within each reflector cavity. Lamp leads 320 are plugged into lampholders 316 located in lamp receptacles 314. Wiring pairs 315 deliver power to the lamps. A plurality of coolant passages 306 are formed in the lamphead-reflector. For ease of manufacturing, the coolant passages can be machined as slots between the lamp receptacles. A top plate 303 is placed over the cooling passages and secured to the monolithic lamphead-reflector body.

The coolant passages 306, as shown, comprise double rectangles. This configuration permits the coolant in the coolant passages to be located very close to the walls of the reflector cavities for improved cooling of the lamps.

FIG. 4 depicts a cross-sectional view of a portion of a monolithic lamphead-reflector 402 including a plurality of reflector cavities 404 and lamps 412. A plurality of lamp receptacles 414 are formed in the lamphead for receiving lampheads 416. A plurality of cooling passages 406 are also formed in the lamphead. Press seals 410 of the lamps are disposed within lead passages 408. Receptacles 419 of lampholders 416 receive outer leads or pins 420 of the lamps and complete the electrical circuit via wiring pairs 415. (The backing plate is not shown in this figure.) Magnets 424 are positioned near the lampheads. The magnets maintain the position of a ferrofluid 426.

A ferrofluid is a liquid which has suspended magnetic particles in it. There are enough particles so a magnet will move the entire mass (fluid and particles) together. Commercial ferrofluids are based on oil (low vapor pressure) containing magnetite (non-conductive Fe3O4) particles. Such ferrofluids are commercially available from Ferrofluidics Corp., 40 Simon St, Nashua, N.H. 03061.

When the outer leads or conductors 420 of a lamp are inserted into a lampholder 416, the ferrofluid surrounds the outer leads and thereby suppresses arcing between the outer leads.

In one embodiment, the outer leads of the lamps are made of a magnetic material. In this embodiment, the magnets help maintain the position of the lamp.

A ferrofluid is a reasonably good dielectric. The amount of ferrofluid used is sufficient to completely fill the cavities surrounding the outer leads of the lamp. The ferrofluid, therefore, prevents pin-to-pin and pin-to-ground arc-over in environments such as low-pressure helium environments. Additional ferrofluids may be added to force the ferrofluids into the gap between the water-cooled lamphead and the lamp press seal. When a thermally-conductive ferrofluid is used, this results in better heat transfer away from the lamp.

High viscosity ferrofluids, ferropastes and ferropolymers can be used to form an atmospheric differential seal.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed is:

1. A lamphead for use in semiconductor processing, comprising:

a monolithic member; and a plurality of lamp receptacles and reflector cavities formed in the monolithic member, each lamp receptacle adapted to support a lamp and each reflector cavity shaped to act as a reflector for the lamp.

2. The lamphead of claim 1, further comprising:

a plurality of coolant passaged formed in the monolithic member.

3. The lamphead of claim 1, wherein the monolithic member comprises at least one of copper and aluminum.

4. The lamphead of claim 1, further comprising:
a reflective coating upon a surface of each reflector cavity.

5. The lamphead of claim 4, wherein the reflective coating comprises at least one of gold and a dielectric stack on a gold layer.

6. The lamphead of claim 1, further comprising:
a plurality of lead passages formed in the monolithic member, each lead passage extending between one of the plurality of the lamp receptacles and one of the plurality of the reflector cavities, and adapted to receive a portion of a lamp.

7. A lamphead assembly for use in semiconductor processing, comprising:
a lamphead;
a plurality of lamp receptacles and reflector cavities formed in the lamphead, each lamp receptacle adapted to support a lamp and each reflector cavity shaped to act as a reflector for the lamp;
at least one lampholder having receptacles for outer leads of a lamp;
a ferrofluid; and
one or more magnets disposed about the lampholder and maintaining position of the ferrofluid near the receptacles;
such that when outer leads of a lamp are inserted into the lamphold receptacles, the ferrofluid surrounds the outer leads thereby suppressing arcing between the outer leads.

8. The lamphead assembly of claim 7, wherein:
the outer leads of the lamp are magnetic, such that the magnets maintain position of the lamp.

9. A semiconductor processing system, comprising:
a process chamber having a support on which a substrate may be positioned during processing; and
a monolithic lamphead having a plurality of lamp receptacles and reflector cavities formed therein, each lamp receptacle adapted to support a lamp and each reflector cavity shaped such that the lamps direct radiant energy onto a substrate on the support.

10. The semiconductor processing system of claim 9, further comprising:
a plurality of coolant passages formed in the monolithic lamphead near the reflector cavities.

11. The semiconductor processing system of claim 9, further comprising:
a reflective coating upon a surface of each reflector cavity.

12. The semiconductor processing system of claim 9, further comprising:
a plurality of lead passages formed in the monolithic lamphead, each lead passage in communication with one of the plurality of lamp receptacles and adapted to receive a lamp seal.

13. A semiconductor processing system, comprising:
a process chamber having a support on which a substrate may be positioned during processing;
a lamphead having a plurality of lamp receptacles and reflector cavities formed therein, each lamp receptacle adapted to support a lamp and each reflector cavity shaped such that the lamps direct radiant energy onto a substrate on the support;
at least one lampholder having receptacles for outer leads of a lamp;
a ferrofluid; and
one or more magnets disposed about the lampholder and maintaining position of the ferrofluid near the receptacles;
such that when outer leads of a lamp are inserted into the lampholder receptacles, the ferrofluid surrounds the outer leads thereby suppressing arcing between the outer leads.

14. The semiconductor processing system of claim 13, wherein:
the outer leads of the lamp are magnetic, such that the magnets maintain position of the lamp.

15. An apparatus for processing a substrate, comprising:
a process chamber having a support on which a substrate may be positioned during processing; and
a monolithic lamphead having a plurality of lamp receptacles and reflector cavities formed therein, each lamp receptacle adapted to support a lamp and the reflector cavities shaped such that the lamps direct radiant energy onto a substrate on the support.

16. The apparatus of claim 15, further comprising:
a plurality of coolant passages formed in the monolithic lamphead.

17. The apparatus of claim 15, further comprising:
a reflective coating upon a surface of each reflecting cavity.

18. The apparatus of claim 15, further comprising:
a plurality of lead passages formed into the monolithic lamphead, each lead passage in communication with one of the plurality of lamp receptacles and adapted to receive a lamp seal.

19. An apparatus for processing a substrate, comprising:
a process chamber having a support on which a substrate may be positioned during processing;
a lamphead having a plurality of lamp receptacles and reflector cavities formed therein, each lamp receptacle adapted to support a lamp and the reflector cavities shaped such that the lamps direct radiant energy onto a substrate on the support;
at least one lampholder having receptacles for outer leads of a lamp;
a ferrofluid; and
one or more magnets disposed about the lampholder and maintaining position of the ferrofluid near the receptacles;
such that when outer leads of a lamp are inserted into the lampholder receptacles, the ferrofluid surrounds the outer leads thereby suppressing acrcing between the leads.

20. The apparatus of claim 19, wherein:
the outer leads of the lamp are magnetic, such that the magnets maintain position of the lamp.

21. The lamphead assembly of claim 7, further comprising:
a plurality of coolant passages formed in the lamphead.

22. The lamphead assembly of claim 7, wherein the lamphead comprises at least one of copper and aluminum.

23. The lamphead assembly of claim 7, further comprising:
a reflective coating upon a surface of each reflector cavity.

24. The lamphead assembly of claim 23, wherein the reflective coating comprises at least one of gold and a dielectric stack on a gold layer.

25. The lamphead assembly of claim 7, further comprising:
a plurality of lead passages formed in the monolithic member, each lead passage extending between one of the plurality of the lamp receptacles and one of the plurality of the reflector cavities, and adapted to receive a portion of a lamp.

26. The semiconductor processing system of claim 13, further comprising:
a plurality of coolant passages formed in the lamphead near the reflector cavities.

27. The semiconductor processing system of claim 13, further comprising:
a reflective coating upon a surface of each reflector cavity.

28. The semiconductor processing system of claim 13, further comprising:
a plurality of lead passages formed in the lamphead, each lead passage in communication with one of the plurality of lamp receptacles and adapted to receive a lamp seal.

29. The apparatus of claim 19, further comprising:
a plurality of coolant passages formed in the lamphead.

30. The apparatus of claim 19, further comprising:
a reflective coating upon a surface of each reflecting cavity.

31. The apparatus of claim 19, further comprising:
a plurality of lead passages formed into the lamphead, each lead passage in communication with one of the plurality of lamp receptacles and adapted to receive a lamp seal.

32. The lamphead of claim 1, wherein said monolithic member consists of a single piece.

33. The lamphead of claim 32, wherein said reflector cavities are machined into said single piece.

34. The semiconductor processing system of claim 9, wherein said monolithic lamphead consists of a single piece.

35. The semiconductor processing system of claim 34, wherein said reflector cavities are machined into said single piece.

36. The apparatus of claim 15, wherein said monolithic lamphead consists of a single piece.

37. The apparatus of claim 36, wherein said reflector cavities are machined into said single piece.

38. The lamphead assembly of claim 7, wherein said lamphead consists of a monolithic member.

39. The semiconductor processing system of claim 13, wherein said lamphead is a monolithic lamphead.

40. The apparatus of claim 19, wherein said lamphead is a monolithic lamphead.

* * * * *